(12) United States Patent
Chuang et al.

(10) Patent No.: US 7,126,100 B1
(45) Date of Patent: Oct. 24, 2006

(54) SYSTEM AND METHOD FOR SENSING USING ADJUSTABLE MODULATION TRANSFER FUNCTION (MTF)

(75) Inventors: Yung-Ho Chuang, Cupertino, CA (US); J. Joseph Armstrong, Milpitas, CA (US); David Lee Brown, Sunnyvale, CA (US); Bin-Ming Benjamin Tsai, Saratoga, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 122 days.

(21) Appl. No.: 10/850,818

(22) Filed: May 21, 2004

(51) Int. Cl.
*H01L 27/00* (2006.01)

(52) U.S. Cl. .................. 250/208.1; 250/214 R
(58) Field of Classification Search ............ 250/208.1, 250/214 R
See application file for complete search history.

(56) References Cited

U.S. PATENT DOCUMENTS 4,989,060 A * 1/1991 Usui ...................... 257/223

\* cited by examiner

*Primary Examiner*—Que T. Le
(74) *Attorney, Agent, or Firm*—Smyrski Law Group, A.P.C.

(57) ABSTRACT

A variable modulated transfer function (MTF) design employing a variable gate voltage source for use in inspecting specimens is disclosed. The design applies a variable gate voltage to each pixel of a sensor, wherein applying the variable gate voltage to each pixel adjusts the MTF of the pixel. MTF adjustment improves adverse effects encountered during inspection, such as aliasing and maintaining contrast.

26 Claims, 6 Drawing Sheets

SYSTEM AND METHOD FOR SENSING USING ADJUSTABLE MODULATION TRANSFER FUNCTION (MTF)

BACKGROUND OF THE INVENTION

1. Field of the Invention

The present invention relates generally to the field of optical imaging, and more particularly to sensing images using adjustable modulation transfer functions (MTFs).

2. Description of the Related Art

Imaging systems are commonly employed in many different fields, including machine vision, microscopy, photography, and semiconductor inspection. Imaging systems are typically composed of an optical system, an imaging device, and some form of computer processing and/or analysis. In this context, imaging can be considered a process or series of operations performed on an object or specimen in order to produce the final image, and may include, for example, receipt of the image by an imaging device, removing errant portions of the image by filtering or processing, and so forth. Each segment of the imaging system can perform one or more operations on the object or specimen.

A block diagram of certain components making up a typical imaging process is presented in FIG. 1. Circular elements in FIG. 1 represent the object or specimen 101 or the detected image 105 of the object, while rectangles represent operations on the object 101. In an imaging process, optical system 102 produces a continuous image of an object or specimen 101. A solid state imager 103, formed of a charge diffuser 106 and image array 107, may change the continuous image or optical image into either an electronic image or an array of values convertible to an electronic image. This electronic image may then be processed at point 104 before rendering the final detected image 105.

Problems associated with the system of FIG. 1, particularly in a high speed scanning or inspection of the object or specimen 101, can include aliasing. Aliasing is the effect occurring when analog information is sampled into pixels, and the resultant pixelized image differs, sometimes significantly, from the original analog signal. Prior approaches to prevent aliasing use optical techniques to modify the resolution of the optical image on the sensor, or use image processing algorithms. These approaches either have limited effectiveness, or adversely affect performance of the imaging system.

One tool that has been employed to describe the performance of an imaging process or system such as that shown in FIG. 1 is the Modulation Transfer Function (MTF). The MTF mathematically describes the contrast at which different spatial frequencies of the object may be transferred. High spatial frequencies correspond to fine detail in the object or specimen 101. An MTF of 100% at a particular spatial frequency transfers that frequency from the object or specimen with full contrast. The resolution of an imaging process or system may be readily expressed in terms of one MTF or a combination of MTFs, because the MTF of various imaging operations can be multiplied together to produce the MTF of the detected image 105. The MTF for an imaging process can be represented by the following equation:

$$MTF_{Image} = MTF_{Optical} * MTF_{Diffusion} * MTF_{Array} * MTF_{Processing} \quad (1)$$

$MTF_{Optical}$ represents the MTF of the optics of the optical system, while $MTF_{Diffusion}$ is the MTF of the charge diffuser 106. $MTF_{Array}$ is the MTF created by the discrete nature of the pixel sampling by the sensor or sensing array, while $MTF_{Processing}$ is the MTF of the image processing subsequent to image formation on the sensing array. Multiplication of the MTFs in the manner shown in Equation (1) can have two adverse effects on detected image 105. First, the contrast of each spatial frequency component degrades with each operation on the object 101. In many cases it is desirable to minimize this degradation and produce a detected image 105 that resembles object or specimen 101 as closely as possible with respect to contrast. Reducing the contrast of specific spatial frequency components in the original object 101 that are outside the region of interest may be advantageous. However, such contrast reduction may cause other spatial frequency components to be more pronounced in the detected image 105.

Second, aliasing remains an issue when using sampling detectors. For example, if the sampling frequency of the solid state imager or sensor 103 is less than the Nyquist frequency of the object or specimen 101, aliasing can occur. Aliasing tends to degrade the detected image 105 and the presence of aliasing causes difficulties in using the detected image 105 in subsequent processing.

Aliasing can be addressed by modifying the MTFs of the optical system 102, the charge diffuser 106, or the image array 107 operations. Several common techniques may be employed to maintain the contrast of the spatial frequencies in the object or specimen 101, or alternately to reduce the contrast of specific spatial frequencies present in the object or specimen 101 by altering the optical system $MTF_{Optical}$. One style reduces the optical resolution using a spatial filter or apertures to reduce the imaging numerical aperture. This approach limits the magnifications and numerical apertures that can be used, and discards light energy associated with the high resolution information. Discarding light energy in a high speed inspection can reduce throughput, or in other words require a longer time period to scan a given region. Another optical anti-aliasing style uses optical filters, such as birefringent plates, to limit optical resolution without discarding light energy. This technique reduces the contrast of the highest spatial frequencies. Such filtering tends to modify the light itself before a solid state sensor converts the light into an image array. Devices operating according to this anti-aliasing style require additional hardware, are generally not effective over a range of wavelengths, may have direction asymmetry, and are designed to work at fixed resolutions. Such filtering can also require operation at wavelengths above 400 nm, while many newer systems operate at wavelengths below 400 nm. Once the solid state imager converts the continuous optical image to a discrete image array, spatial frequency information transferred from the object or specimen is permanently altered.

The image may be modified subsequent to this alteration using image processing algorithms 104. These algorithms attempt to reduce the impact of aliasing by altering the image processing 104 $MTF_{processing}$. However, such algorithms may not effectively address aliasing and other image artifacts produced within the solid state imager when forming the image array. General aliasing artifacts are impossible to remove after the image is transferred to the solid state sensor of the optical imaging system, as the artifacts are generally indistinguishable from true image detail. Due to the strong resemblance between artifacts and image detail, no effective software anti-aliasing filters are available.

The solid state imager itself may be used to control the MTF of the final image. U.S. Pat. No. 6,265,736 presents a design that uses the image array operation of the solid state sensor to modify the MTF. The '736 patent uses a pixel "binning" approach which spatially combines pixels into a larger pixel by combining them in "bins." This approach modifies the $MTF_{Array}$ portion of the imaging process. The '736 type design offers limited control and adjustment of the MTF because an integer number of pixels must be combined. For systems that operate at high speed or at sensor pixel sizes larger than about $\frac{1}{8}^{th}$ the optical resolution, this approach tends to produce unacceptable results.

Thus while it can be advantageous to employ a tunable MTF in imaging a specimen or object, certain design limitations exist when using the MTF that can distort or compromise the image ultimately rendered. It would be desirable to have the ability to control the sensor MTF to eliminate or dramatically reduce the effects of aliasing and the adverse effects associated with altered image contrast, without adversely impacting system performance, cost, or complexity.

SUMMARY OF THE INVENTION

According to a first aspect of the present design, there is provided a sensor comprising a pixel having a modulated transfer function (MTF) associated therewith, and a variable gate voltage element connected to the pixel and configured to change the pixel MTF.

According to a second aspect of the present design, there is provided a method for sensing an image of a specimen. The method comprises receiving light energy from the specimen and applying the light energy to a sensor comprising at least one pixel, and applying a variable gate voltage to each pixel, wherein applying the variable gate voltage to each pixel adjusts a modulated transfer function (MTF) of the pixel.

According to a third aspect of the present design, there is provided a system for inspecting a specimen comprising a sensor. The system comprises at least one pixel within the sensor formed from a substrate and comprising a depletion region and a non depleted depth, an insulator formed above the substrate, a conductor formed above the insulator, and one or more variable gate voltage source connected to the conductor and the substrate. Each variable gate voltage source applies a variable voltage to change the modulated transfer function (MTF) of its respective pixel.

These and other objects and advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present design utilizes an adjustable MTF to reduce the effects of aliasing and maintain contrast when examining specimens using an optical system. Adjustment of the MTF is performed by altering voltage applied to a pixel, thereby enhancing the ability of the pixel to receive light and provide an accurate rendering of the final image.

Figure 1:
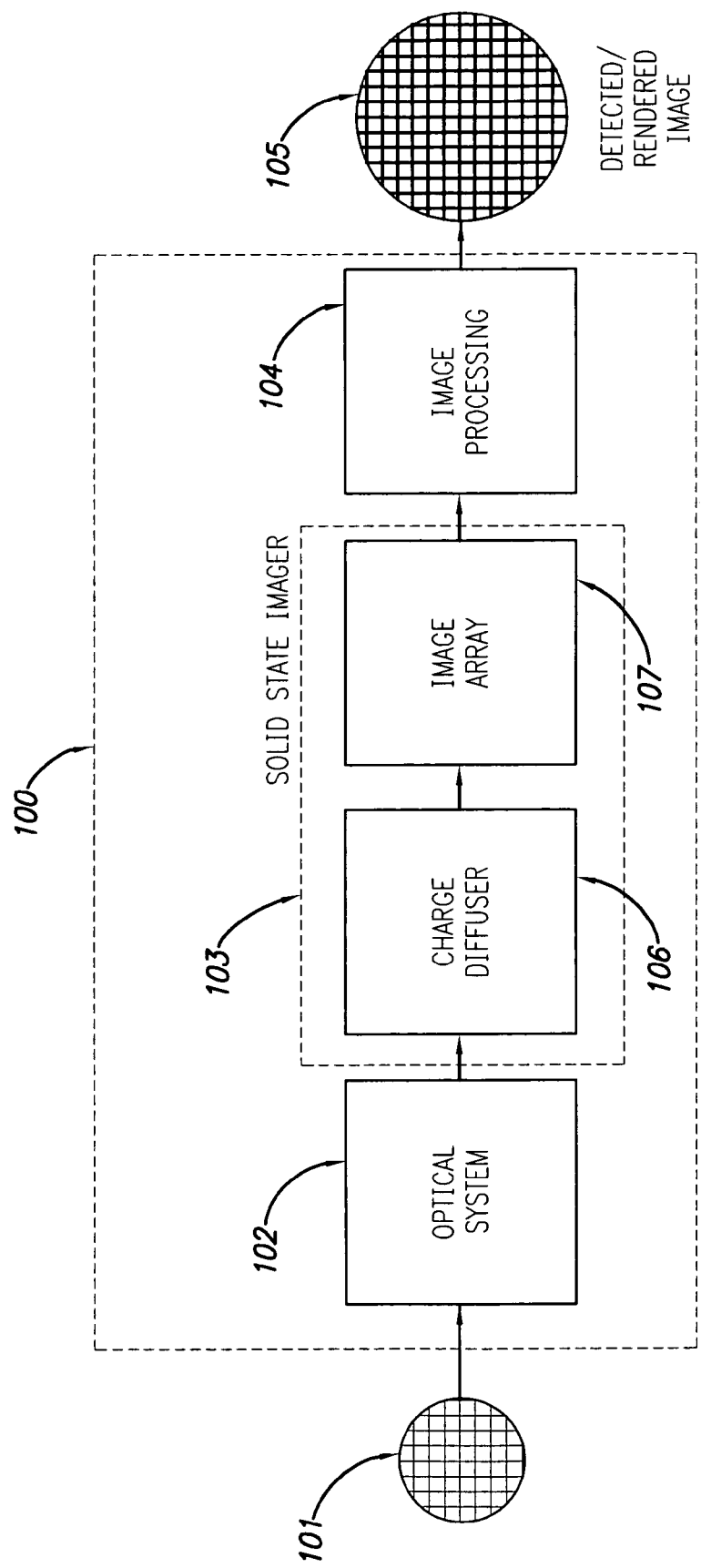
FIG. 1 is a block diagram of certain components making up a typical imaging process.
Figure 2:
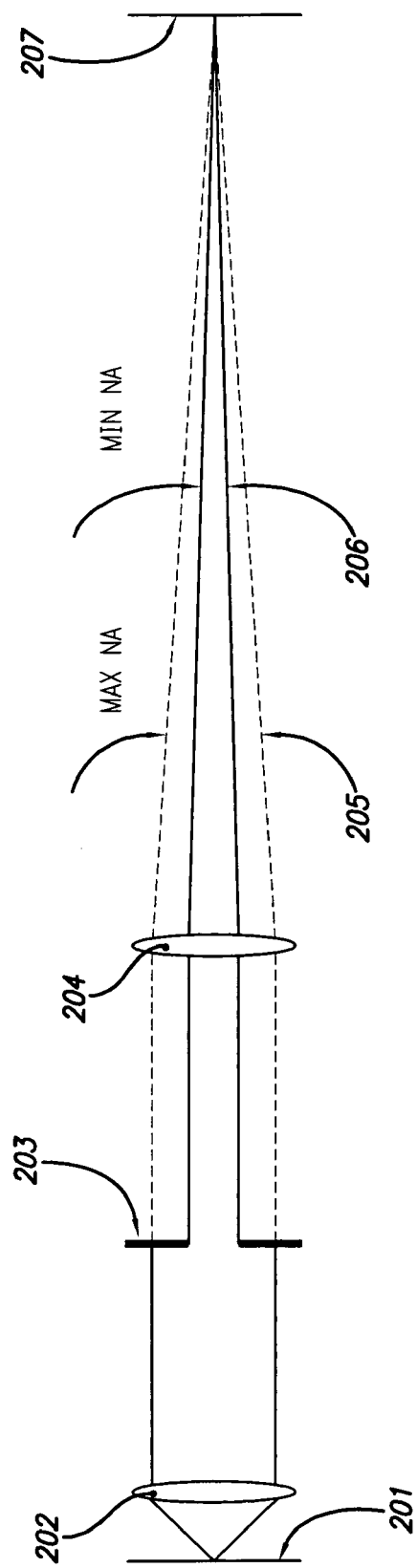
FIG. 2 illustrates a schematic of a typical optical system.

A schematic of a typical optical system is shown in FIG. 2. From FIG. 2, light from object or specimen 201 may be collected by collection objective 202. Light then passes through aperture 203 and is imaged by imaging optics 204 onto the solid state imager 207. Here the optical system 102 of FIG. 1 is generally represented by collection objective 202, aperture 203 and imaging optics 204. When the aperture 203 is at the maximum diameter, the NA is also at a maximum, shown by point 205. This maximum diameter aperture-maximum NA arrangement produces an $MTF_{Optical}$ having relatively high spatial frequencies, generally the highest transferable by the optical system. The diameter of aperture 203 can be decreased to reduce the NA 206 and decrease the $MTF_{Optical}$ of the optical system. However, modifying the NA of the light imaged on the sensor can not practically be done at high speeds because of changing light levels and speed limitations for mechanical apertures. Further, reductions in NA reduce the light level, and such reductions are therefore undesirable.

The present design efficiently utilizes the charge spreading operation within individual pixels of the solid state imager to adjust the $MTF_{Diffusion}$ and hence the resulting $MTF_{Image}$. Use of the charge spreading operation enables variation of the sensor $MTF_{Image}$ in a precise manner and has several beneficial properties. First, the charge diffusion operation is a smooth function. Many other techniques or operations used to modify the $MTF_{Image}$ have discontinuities and cause image artifacts, such as the "binning" techniques described above. "Binning" is a discrete process, and can result in anomalies in the final rendered image. Second, the $MTF_{Image}$ can be dramatically reduced beyond the maximum spatial frequency of interest, making the $MTF_{Diffusion}$ an effective integrating short pass filter, effectively filtering noise while maintaining the quantity of the light received. Third, use of the adjustable $MTF_{Diffusion}$ in this manner allows the system to process the continuous optical image before the image is collected in a discrete image array. Pre-collection processing allows more flexibility in controlling the $MTF_{Image}$ before errors can be introduced by the image array 107 sampling operation. Fourth, charge spreading can be controlled in real time at very high rates of speed, enabling dynamic adjustment during high speed inspection.

These properties allow the solid state imager $MTF_{SSimager}$ which equals the $MTF_{Diffusion}$ multiplied by $MTF_{Array}$, to be adjusted for a variety of applications. The applications include preventing aliasing while preserving the energy of high spatial frequency components. This solid state imager adjustable $MTF_{SSImager}$ can efficiently operate as an integrating low pass filter. The low pass filtering can be applied, in the semiconductor wafer inspection context, to standard front side or back side sensor architecture, and can be used for frame mode as well as Time Delay and Integration (TDI) mode operation.

Currently available sensors have fixed $\text{MTF}_{Diffusion}$ values associated with all pixels. A sensor having an adjustable $\text{MTF}_{Diffusion}$ provides an adjustable smoothing function for the sensor, the smoothing function having a well controlled hyperbolic secant shape. The system can adjust the width of this smoothing function by changing the voltage of the storage well gate to control the non-depleted layer thickness. In the semiconductor inspection scenario, the system can change voltage using a standard front side or back side sensor architecture. Voltage alteration of the storage well gate can limit the effect of aliasing, and adjustment of the $\text{MTF}_{Diffusion}$ can provide for system-to-system matching by making the $\text{MTF}_{image}$ the same from machine to machine.

The first embodiment of the present design is a solid state imager having an $\text{MTF}_{Diffusion}$ controlled by adjusting the relative voltage difference between the front side poly gate and the back side die attach of individual pixels. Either the front side poly gate voltage or the back side die attach voltage can be adjusted to produce the same effect. This method of $\text{MTF}_{Diffusion}$ control can be used with either front side illuminated sensors or back side illuminated sensors.

Figure 3A:
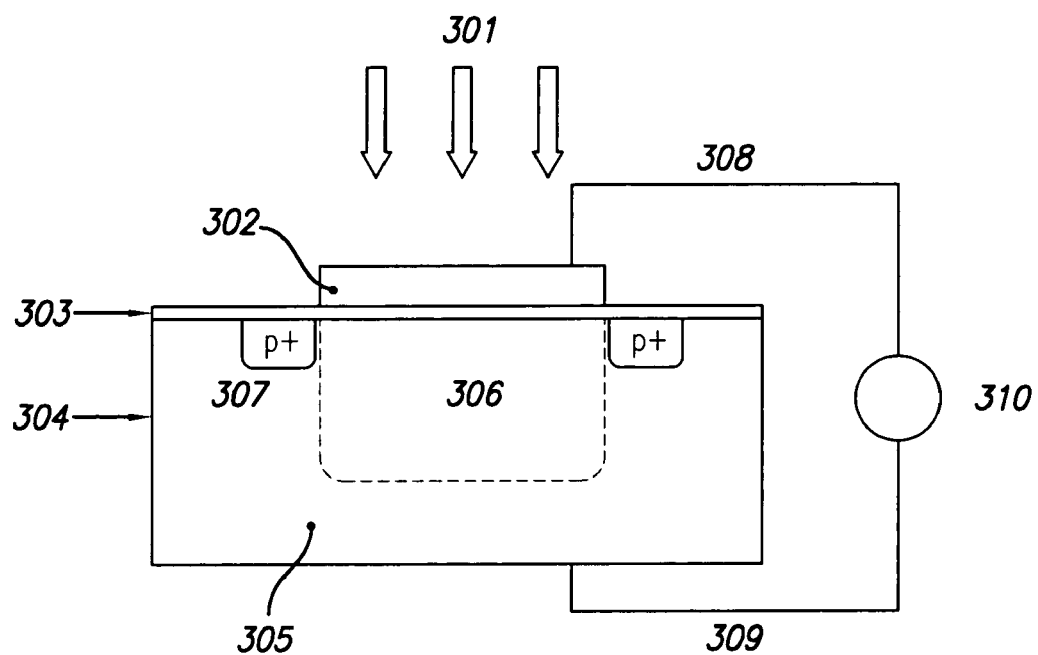
FIG. 3A shows a side view of a single pixel solid state imager having a variable gate voltage source attached to a front illuminated sensor according to the present design.
Figure 3B:
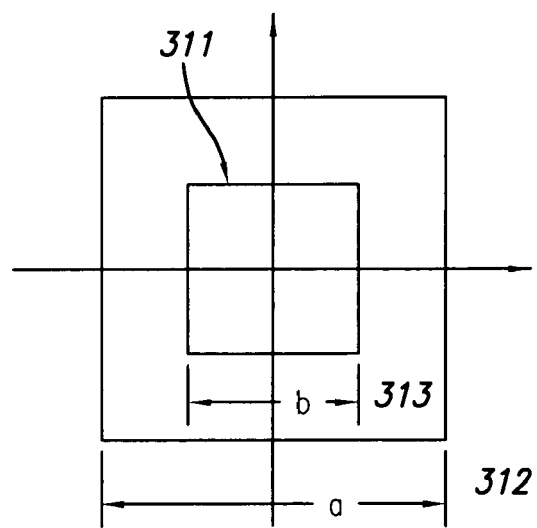
FIG. 3B is a front view of a single pixel solid state imager from a front illuminated sensor according to the present design.

A schematic of a single pixel solid state imager 300 from a front illuminated sensor according to the present design is shown in FIG. 3A. From FIG. 3A, front side illumination 301 comprises any standard form of illumination used in the presence of a pixel such as is shown, and is typically a brightfield illuminator such as those known in the art. Conductor 302 receives the front side illumination 301, and conductor 302 sits atop insulator 303. Insulator 303 is typically formed from an oxide material. A silicon substrate 304 sits beneath insulator 303, and has both a depletion region 306 and a non-depleted depth 307 located therein. The depletion region 306 is defined by the conductor 302, the p-plus source and drain 307, and voltage source 310. p-plus regions 307 are located on each side of depletion region 306 and within substrate 304. Voltage is applied to the conductor 302 and the non depleted depth 305 as shown, where front side gate 308 interfaces with voltage source 310 and die attach 309. Adjusting the voltage at voltage source 310 adjusts the depth of the depletion region 306 and thus also adjusts the remaining non depleted depth 305. The voltage from voltage source 310 causes photoelectrons generated in the depleted depth 306 to be contained without escaping into the non-depletion region 305. FIG. 3B illustrates the pixel and photosensitive area relative to the entire area of the pixel. From FIG. 3B, the size of the photosensitive area 311 is defined by the pixel spacing 312 and is significantly smaller than the entire area of the pixel.

Figure 4A:
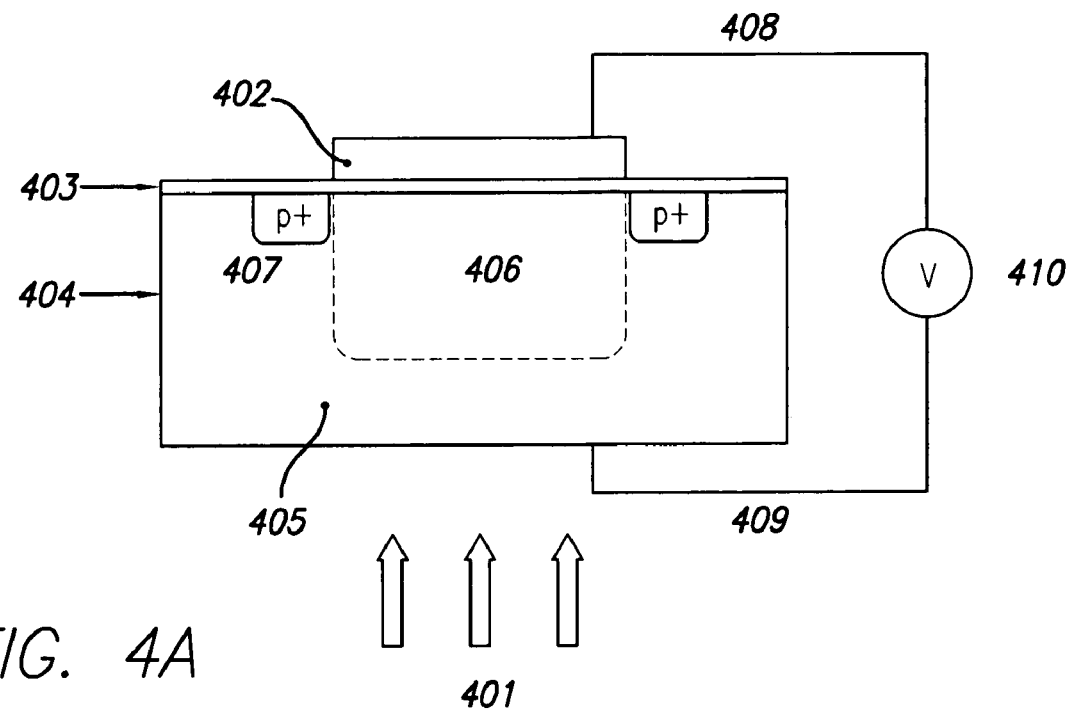
FIG. 4A illustrates a side view of a single pixel solid state imager having a variable gate voltage source attached to a a back illuminated sensor according to the present design.
Figure 4B:
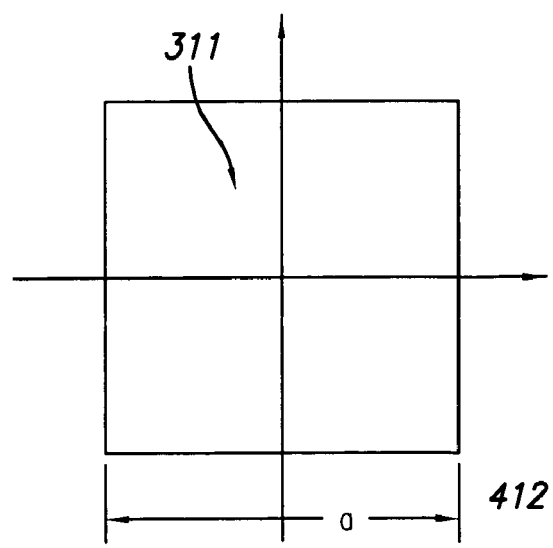
FIG. 4B represents a front view of a single pixel solid state imager from a back illuminated sensor according to the present design.

A schematic of a single pixel of a back illuminated sensor is shown in FIG. 4B. The size of the photosensitive area 411 is defined by the pixel spacing 412 and, in general, no structures exist on the back side of the sensor to block light. A mask or lens array may be positioned on the back side of the sensor or in proximity to the sensor to affect the $\text{MTF}_{Array}$. From FIG. 4A, a solid state imager is assembled on a substrate 404 that also has an insulating layer 403. The silicon substrate 404 may be an epi silicon layer. The insulating layer 403 is typically an oxide. Back side illumination 401, transmitted from an illuminator (not shown) enters the solid state imager 400 from the nondepleted depth 405 side of substrate 404. A depletion region is defined by the conductor 402, the p-plus source and drain 407, and voltage 410. The arrangement shown generates photoelectrons in the non depleted depth region 405. Such an arrangement generates photoelectrons within the first micron of depth for wavelengths less than 450 nm. Voltage source 410 is positioned between the front side gate 408 and the back side die attach 409. Again, adjusting this relative voltage 410 adjusts the depth of the depletion region 406 and thus also adjusts the remaining non depleted depth 405. The voltage source 410 causes photoelectrons generated in the non depleted depth 405 to be accelerated into the depletion region 406.

The $\text{MTF}_{Diffusion}$ of the solid state imager is defined by the charge from a single pixel that leaks into adjacent pixels. This charge leakage is a function of illumination wavelength and bias voltage. Illumination wavelength is generally chosen based on the optical resolution requirements for the overall optical system based on the properties of the sample or specimen being inspected. Generally, longer wavelengths exhibit lower absorption by the silicon and penetrate deeper into the sensor. This deep penetration decreases the probability the electron will migrate to an adjacent pixel. For wavelengths less than 450 nm, the absorption depth is much less than one micron, and $\text{MTF}_{Diffusion}$ variation due to wavelength tends to be insignificant. $\text{MTF}_{Diffusion}$ adjustment using the bias voltage of the sensor is relatively uniform for wavelengths below 450 nm. This uniform adjustability allows for spectral matching and MTF matching from one sensor to the next.

In order to effectively use the gate voltage to adjust solid state imager $\text{MTF}_{SSImager}$, the system must accurately quantify the change in $\text{MTF}_{Diffusion}$ for a particular change in the gate voltage. The system determines the change in two parts. First, the system determines the depletion depth as a function of gate voltage. Depletion depth as a function of gate voltage is generally known and discussed in literature known to those skilled in the art. A simplified equation describing the depletion depth as a function of gate voltage is:

$$x_d = -\frac{\varepsilon_{Si} t_{ox}}{\varepsilon_{ox}} + \left(\frac{2\varepsilon_{Si}}{qN_A}\right)^{1/2} (V_G - V_{FB} + V_{ox} + V_{IMP})^{1/2} \quad (2)$$

where
$\varepsilon_{ox}$ is oxide permittivity
$\varepsilon_{Si}$ is silicon permittivity
$\varepsilon_o$ is vacuum permittivity
q is elementary charge
$t_{ox}$ is oxide thickness
$N_A$ is p-doping concentration
$V_{FB}$ is flat band voltage
$V_{OX}$ is oxide voltage
$V_{IMP}$ is implantation voltage
$V_G$ is gate voltage Equation (2) assumes no surface recombination, a short diffusion length for electrons in the material, and a sufficiently high optical absorption such that photons do not penetrate too deeply into the material. For many practical sensors, Equation (2) will closely approximate actual measurements.

Figure 5:
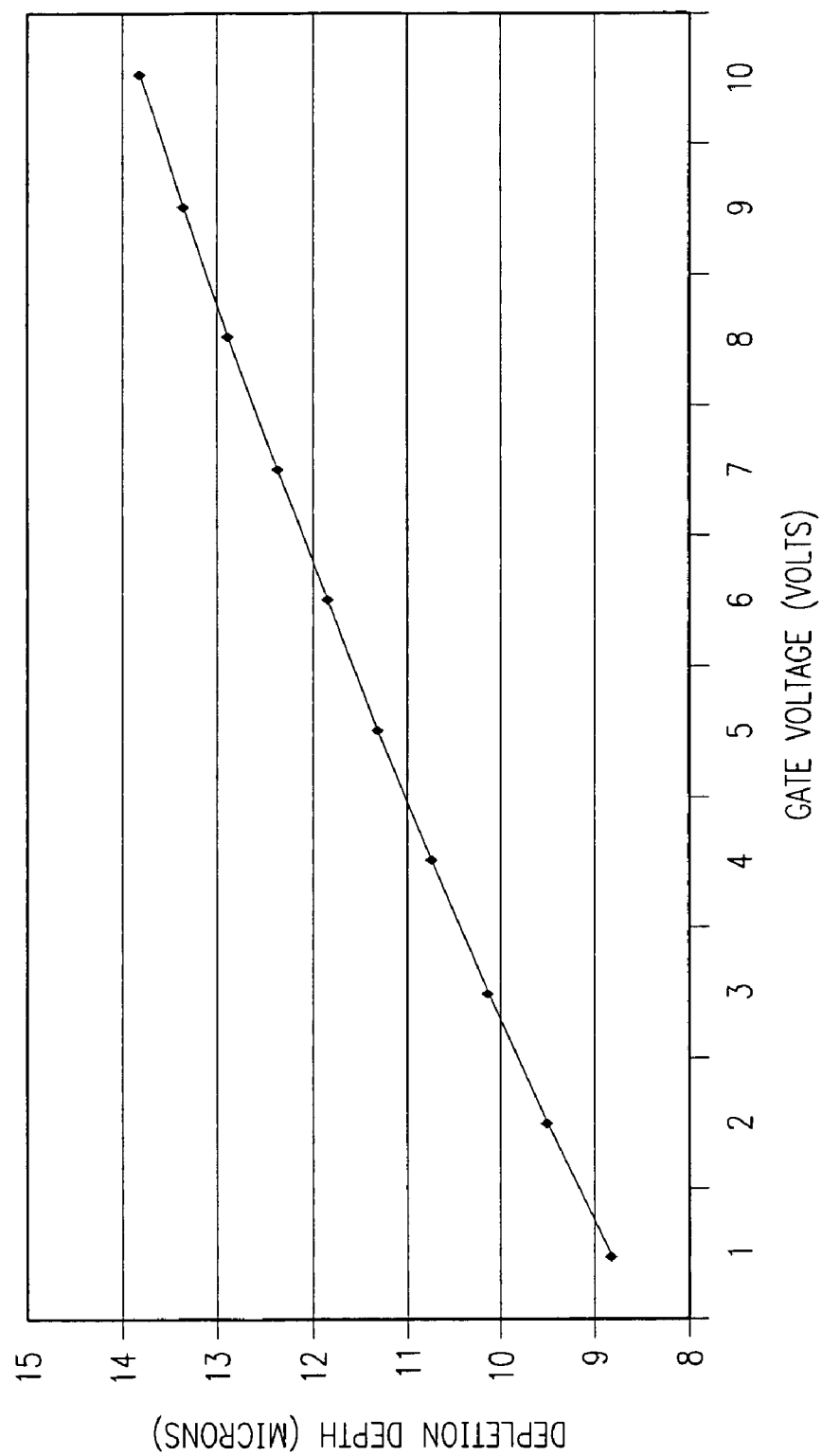
FIG. 5 illustrates the effect of the gate voltage $V_G$ on the depletion depth of a pixel for a sample sensor.

The oxide voltage from Equation (2) can be calculated as:

$$V_{OX} = \frac{qN_A x_j^2}{2\varepsilon_{Si}} \left(1 + \frac{\varepsilon_{Si} t_{ox}}{\varepsilon_{ox} x_j}\right)^2 \quad (3)$$

where $x_j$ is the n-layer thickness. The implantation voltage from Equation (2) can be calculated as:

$$V_{IMP} = \frac{qN_D x_j^2}{2\varepsilon_{Si}} \left(1 + \frac{2\varepsilon_{Si} t_{ox}}{\varepsilon_{ox} x_j}\right) \quad (4)$$

where $N_D$ is the n-doping concentration. The flat-band voltage $V_{FB}$ from Equation (2) due to the interface between the oxide and silicon and is typically in the range of approximately −1.0 V. Most of these parameters are determined by the method and materials of sensor construction. The only variable available for adjustment after the sensor is completely formed is the gate voltage $V_G$. Using a combination of Equations (2), (3), and (4), the system can calculate the effect of the gate voltage $V_G$ on the depletion depth. The effect for an example sensor is shown in FIG. 5. A change in the gate voltage from 3 volts to 10 volts in this situation can increase depletion depth in the range of approximately 10 to 14 microns. The non-depleted depth (L) for the sensor can then be calculated using the equation:

$L$=sensor thickness−depletion depth−average photon penetration depth  (5)

The system then computes the $MTF_{Diffusion}$ with respect to the remaining non-depleted depth in the sensor. For a backside-thinned sensor operating in the presence of wavelengths below 450 nm, the diffusion $MTF_{Diffusion}$ at a particular frequency f, $MTF_{Diffusion}$ (f) is:

$$MTF_{Diffusion}(f) = \sec h(2\pi L f) = \frac{2}{e^{2\pi L f} + e^{-2\pi L f}}. \quad (6)$$

The system can then adjust the width of the hyperbolic secant by changing the depth of the non-depleted region and employing Equation (6).

The array MTF, $MTF_{Array}$, results from sampling by the solid state imager pixels. The $MTF_{Array}$ at frequency f is given by:

$$MTF_{Array}(f) = \frac{\sin(\pi f a)}{\pi f a} \quad (7)$$

From Equation (1), the $MTF_{Image}$ is a product of all the MTF components of the system. Adjusting the optical system $MTF_{optical}$, the pixel sampling $MTF_{Array}$, or image processing $MTF_{processing}$ may be undesirable, as previously discussed. The only other method of adjusting the $MTF_{Image}$ is to adjust $MTF_{Diffusion}$.

The system adjusts $MTF_{Diffusion}$ according to Equations (2), (3), (4), (5), and (6). These Equations contain many values that are fixed after the solid state imager is constructed. The only value in these Equations that can be easily controlled to alter the $MTF_{diffusion}$ once the solid state imager has been constructed is the gate voltage Vg.

Figure 6:
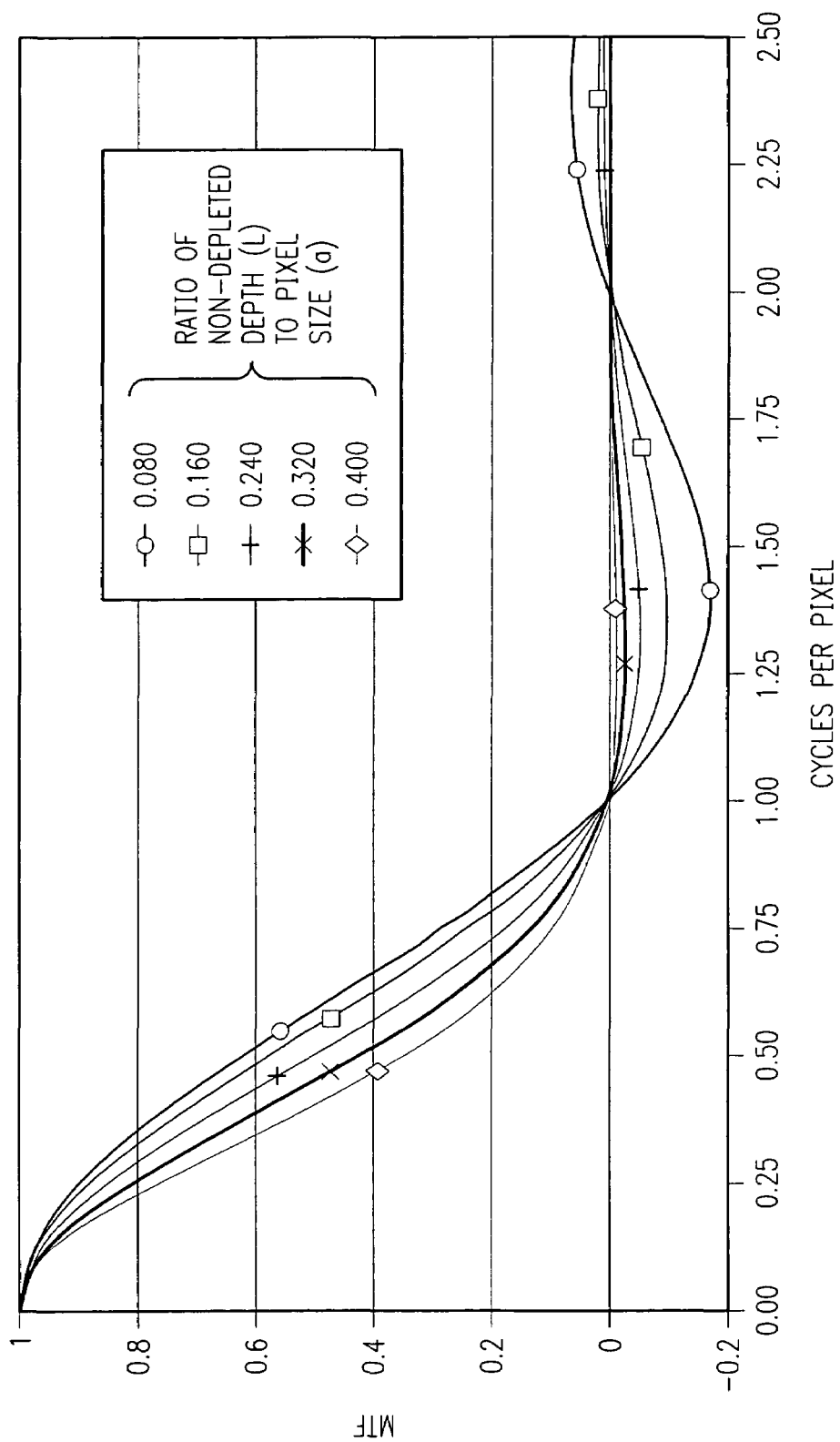
FIG. 6 is a plot of the overall MTF for a solid state imager.

The relation of gate voltage Vg to $MTF_{diffusion}$ can be seen from FIGS. 5 and 6. FIG. 5 is a plot of Equation (2), the depletion depth $X_d$ as a function of different gate voltages Vg on a typical CCD sensor. The depletion depth $X_d$ increases with gate voltage in a predictable manner. This result is then used with Equations (5), (6), and (7) to produce the plot in FIG. 6 of $MTF_{SSImager}$ versus the normalized non-depleted depth L/a where a is the sensor pixel size. Frequency f is in units of cycles per pixel. As shown in FIG. 6, several curves are plotted for different values of L/a. The result of FIG. 6 is that as the gate voltage Vg increases, the normalized non-depleted depth L/a increases, and the $MTF_{Diffusion}$ decreases for higher spatial frequencies.

Adjusting sensor MTF in the manner discussed can effectively reduce the impact of aliasing without sacrificing energy associated with high spatial frequencies. In the environment shown, aliasing can occur at spatial frequencies higher than 0.5 cycles per pixel. However, as shown in FIG. 6, decreasing the gate voltage tends to decrease the $MTF_{SSImager}$ for these spatial frequencies, and also tends to reduce the effects of aliasing. FIG. 6 shows a calculation example for a back side sensor. Using the $MTF_{Diffusion}$ adjustment can therefore offer beneficial results for spatial frequencies greater than one cycle per pixel, with significant reduction of aliasing.

The sensor operating according to the $MTF_{Diffusion}$ adjustment can also be applied as an integrating low pass filter. The sensor can effectively smear the pattern image while preserving the integrated defect signal. Smearing the pattern image can reduce random noise and can improve die-to-die and die-to-database comparison in the semiconductor inspection realm. For example, the $MTF_{Diffusion}$ adjustment anti-alias sensor can be used to smooth metal pattern noise, or noise associated with repeated metal patterns on the surface of the semiconductor die, while simultaneously improving the detectability of many types of defects. By making real time changes to the gate voltage the anti-aliasing can be tailored to the inspection applications or regions such as high density or low density repeating patterns, or unpatterned specimens.

Semiconductor inspection typically uses high NA optics for high resolution and seeks to collect as much semiconductor wafer or pattern defect light energy as possible. High defect signal-to-noise ratios are desirable. The system achieves a high defect signal to noise ratio by imaging as much light as possible on the sensor. Maximizing the amount of light on the sensor also allows for increased inspection speed. However, magnifications allowing for increased inspection speed can result in aliased images. The typical method employed to prevent aliasing in this context is reducing the NA of the optics in order to reduce the optical resolution. NA reduction in this manner also tends to reduce available light on the sensor. The present design enables high speed inspection at reduced magnifications while still maintaining a relatively high NA and preserving the defect signal. The anti-alias adjustable $MTF_{Diffusion}$ sensor presented can also improve dark field inspection performance by allowing collection of high angle scattering from small defects without pattern aliasing. More energy is also collected, thereby improving the defect signal for small features.

Sensor gate voltages are typically set in a predetermined manner to optimize sensor readout performance or to maximize the sensor $MTF_{SSImager}$. In the present design, the system can adjust sensor gate voltage in real time to control the anti-aliasing depending on the frequencies in the image. For example, the system can dynamically observe the image and adjust the voltage to anti-alias the image before the image is finally received and stored. The system can adjust the sensor gate voltage in real time to provide anti-aliasing during semiconductor inspection. This adjustment may employ four steps. The system first determines the magnitude of aliasing based on the $MTF_{Optical}$ of the system. The system then images patterns with the calculated line frequencies that may cause aliasing. One method to obtain these patterns is to produce a test pattern on a semiconductor sample. These test patterns can take the form of groups of lines with each group having a particular line frequency, or can take the form of a chirped grating or a group of lines where the line frequency gradually changes. When the system identifies spatial frequencies causing aliasing for the particular optical configuration, this information can be stored in a computer memory. Another way to obtain these patterns is to use the geometries of interest on the semiconductor wafer directly. This approach can account for additional aliasing effects produced by sub-surface patterns, such as those frequently found on semiconductor wafers.

The system thirdly can determine the gate voltage that will minimize the aliasing effect without excessively degrading the $MTF_{Image}$. The system may receive two images, with one of the images having the object moved very slightly. Less than one line period may be required. This movement to generate the second image may be a relatively slight rotation or translation of the object. These small motions should not have a significant effect on the low frequency image contrast values in the absence of aliasing. However if aliasing is present, these small motions will tend to change the contrast values in the image. The system may then adjust the gate voltage until the image is stable when slightly rotated or translated. Fourthly, the system adjusts the gate voltage as the semiconductor wafer is inspected. The line frequencies of semiconductor structures are known in advance and can be part of the semiconductor inspection recipe. For example, memory areas and logic areas are particular regions having high spatial frequencies that can produce aliasing. When the system inspects these areas, the system can adjust gate voltage to limit the effect of aliasing according to the measurements performed on test structures.

Alternately, the system may employ specialized computing devices and data acquisition hardware to perform an initial aliasing measurement and voltage adjustment at high speed as the semiconductor sample is being inspected.

While back thinned sensors and front side sensors have been discussed, other types of sensors may benefit from an adjustable $MTF_{Diffusion}$ configuration, including but not limited to CMOS and TDI sensors.

The design presented herein and the specific aspects illustrated are meant not to be limiting, but may include alternate components while still incorporating the teachings and benefits of the invention, namely the adjustable MTF sensor and sensing operations employed to reduce adverse effects of aliasing and contrast degradation. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A sensor comprising:
   a pixel having a modulated transfer function (MTF) associated therewith; and
   a variable gate voltage element connected to the pixel and configured to change the pixel MTF.

2. The sensor of claim 1, wherein pixel MTF changes by applying a variable gate voltage to the pixel.

3. The sensor of claim 2, wherein the pixel comprises a depletion region and a non depleted depth, and wherein applying one or more variable gate voltages alters the non depletion depth of the pixel.

4. The sensor of claim 1, wherein the sensor comprises a back thinned silicon sensor.

5. The sensor of claim 1, wherein the sensor is a front side sensor.

6. The sensor of claim 1, wherein the sensor is a CMOS sensor.

7. The sensor of claim 1, wherein a voltage associated with the variable gate voltage element is adjustable in real time during inspection of a specimen.

8. A method for sensing an image of a specimen, comprising:
   receiving light energy from the specimen and applying the light energy to a sensor comprising at least one pixel; and
   applying a variable gate voltage to each pixel, wherein applying the variable gate voltage to each pixel adjusts a modulated transfer function (MTF) of the pixel.

9. The method of claim 8, wherein light energy comprises at least one from a group comprising brightfield light energy and darkfield light energy.

10. The method of claim 8, wherein each pixel comprises a depletion region, and wherein applying the variable gate voltage physically alters the depletion region of the pixel, thereby adjusting the MTF.

11. The method of claim 8, wherein applying the variable gate voltage occurs in real time during inspection of a specimen.

12. The method of claim 8, wherein applying the variable gate voltage enhances the anti-aliasing properties of the sensor.

13. A system for inspecting a specimen comprising a sensor, the system comprising:
    at least one pixel within the sensor formed from a substrate and comprising a depletion region and a non depleted depth;
    an insulator formed above the substrate;
    a conductor formed above the insulator; and
    a variable gate voltage source connected to the conductor and the substrate;
    wherein the variable gate voltage source applies a variable voltage to change the modulated transfer function (MTF) of the pixel.

14. The system of claim 13, wherein the pixel comprises a depletion region and a non depleted depth, and wherein applying the variable rate of voltage alters the non depletion depth of the pixel.

15. The system of claim 13, wherein the sensor comprises a back thinned silicon sensor.

16. The system of claim 13, wherein the sensor is a front side sensor.

17. The system of claim 13, wherein the sensor is a CMOS sensor.

18. The system of claim 13, wherein a voltage associated with the variable gate voltage source is adjustable in real time during inspection of a specimen.

19. The system of claim 14, wherein altering the non depletion depth of the pixel comprises adjusting a hyperbolic secant width used to compute the MTF.

20. The system of claim 13, further comprising an illumination source capable of applying illumination to a side of the pixel comprising the conductor.

21. The system of claim 13, further comprising an illumination source capable of applying illumination to a side of the pixel comprising the substrate.

22. The method of claim 12, further comprising determining a value of the variable gate voltage to reduce anti-aliasing before inspection by imaging a sample containing test patterns.

23. The method of claim 12, further comprising determining a value of the variable gate voltage to reduce anti-aliasing before inspection by imaging a similar structure on a semiconductor wafer.

24. The method of claim 12, further comprising determining a value of the variable gate voltage to reduce anti-aliasing before inspection by imaging a similar structure on a reticle.

25. The method of claim 12, further comprising comparing a plurality of frames to determine a value of the variable gate voltage to reduce anti-aliasing, wherein a first position of the specimen in at least one frame differs from a second position of the specimen in another frame.

26. The system of claim 21, wherein the illumination source contains wavelengths less than 400 nm.

* * * * *